(12) United States Patent
Quaife (10) Patent No.: US 8,559,147 B1
(45) Date of Patent: Oct. 15, 2013

(54) PROVIDING OVERVOLTAGE PROTECTION BY USING REDUNDANT FEEDBACK PINS

(75) Inventor: Philip R. Quaife, Santa Clara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 336 days.

(21) Appl. No.: 13/112,774

(22) Filed: May 20, 2011

(51) Int. Cl.
*H02H 3/00* (2006.01)

(52) U.S. Cl.
USPC ............................................ 361/88; 361/91.1

(58) Field of Classification Search
USPC .................................................... 361/88, 91.1
See application file for complete search history.

(56) References Cited

U.S. PATENT DOCUMENTS

2007/0145964 A1*  6/2007  Katoh ............................ 323/285
2009/0121696 A1*  5/2009  Chien et al. ................... 323/285

* cited by examiner

*Primary Examiner* — Rexford Barnie
*Assistant Examiner* — Tien Mai
(74) *Attorney, Agent, or Firm* — Harrity & Harrity, LLP (57) ABSTRACT

A circuit board includes a controller, a first feedback pin, and a second feedback pin. The controller determines a first voltage measurement associated with the first feedback pin. The controller further determines whether the first feedback pin is disconnected from the controller based on the first voltage measurement. The controller determines a second voltage measurement associated with the second feedback pin when the first feedback pin is disconnected from the controller. The controller also adjusts an output voltage of the controller based on the second voltage measurement when the first feedback pin is disconnected from the controller.

20 Claims, 6 Drawing Sheets

PROVIDING OVERVOLTAGE PROTECTION BY USING REDUNDANT FEEDBACK PINS

BACKGROUND

A printed circuit board (PCB) may include a controller that determines an amount of voltage to output onto the PCB based on a voltage measurement associated with a feedback pin connected to the controller. Government regulations and incentives have spurred the use of lead-free solder for PCBs, which is increasing instances of improper soldering. When the feedback pin is not properly soldered onto the PCB, the controller may increase the amount of voltage being outputted to a highest possible amount. The output of the highest possible amount of voltage may result in an overvoltage (i.e., an increase of voltage above a maximum allowable threshold of a component of the PCB). The overvoltage may damage and/or destroy multiple components of the PCB, such as application-specific integrated circuits (ASICs), memory chips, microprocessors, signal processors, etc.

A possible current solution, to prevent overvoltage from occurring on a PCB, is to utilize shunt protection circuitry. The shunt protection circuitry is expensive and takes up valuable space of the PCB.

SUMMARY

According to one aspect, a circuit board may include: a first feedback pin, at a first location of the circuit board, to enable determination of a first voltage measurement at the first location; a second feedback pin, at a second location, to enable determination of a second voltage measurement at the second location of the circuit board; and a controller. The controller may determine whether the first feedback pin is disconnected from the controller; determine an amount of an output voltage based on the second voltage measurement when the first feedback pin is disconnected from the controller; determine the amount of the output voltage based on the first voltage measurement or the second voltage measurement when the first feedback pin is not disconnected from the controller; and adjust the amount of the output voltage, transmitted across the circuit board, to at least one of the first feedback pin or the second feedback pin based on at least one of the first voltage measurement or the second voltage measurement.

According to another aspect, a method may include: determining, by a controller of a circuit board, a first voltage measurement associated with a first feedback pin of the circuit board; determining, by the controller, whether the first feedback pin is disconnected from the controller based on the first voltage measurement; determining, by the controller, a second voltage measurement associated with a second feedback pin, of the circuit board, when the first feedback pin is disconnected from the controller; and adjusting, by the controller, an output voltage of the controller based on the second voltage measurement when the first feedback pin is disconnected from the controller.

According to yet another aspect, a method may include: providing a controller on a circuit board; providing a first feedback pin on the circuit board; and providing a second feedback pin on the circuit board. The controller may include a converter, and may provide an output voltage. The first feedback pin may receive the output voltage as a first input voltage. The second feedback pin may receive the output voltage as a second input voltage. The controller may further adjust an amount of the output voltage based on a first voltage measurement of the first input voltage when the first voltage measurement is greater than zero. The controller may also adjust the amount of the output voltage based on a second voltage measurement of the second input voltage when the first voltage measurement is equal to zero or below a minimum predefined threshold.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

An embodiment, described herein, may provide overvoltage protection by utilizing redundant feedback pins on a printed circuit board (PCB). The PCB may include a controller, a first feedback pin on a first side of the PCB, and a second (redundant) feedback pin on a second side of the PCB. A first feedback connection may connect the first feedback pin to the controller, and a second feedback connection may connect the second feedback pin to the controller. The controller may adjust an amount of voltage being outputted (provided) by the controller based on a first voltage measurement received from the first feedback point unless/until the controller determines a break exists in the first feedback connection. When the controller determines that the break exists in the first feedback connection, the controller may adjust the amount of voltage being outputted by the controller based on a second voltage measurement received from the second feedback point.

Figure 1:
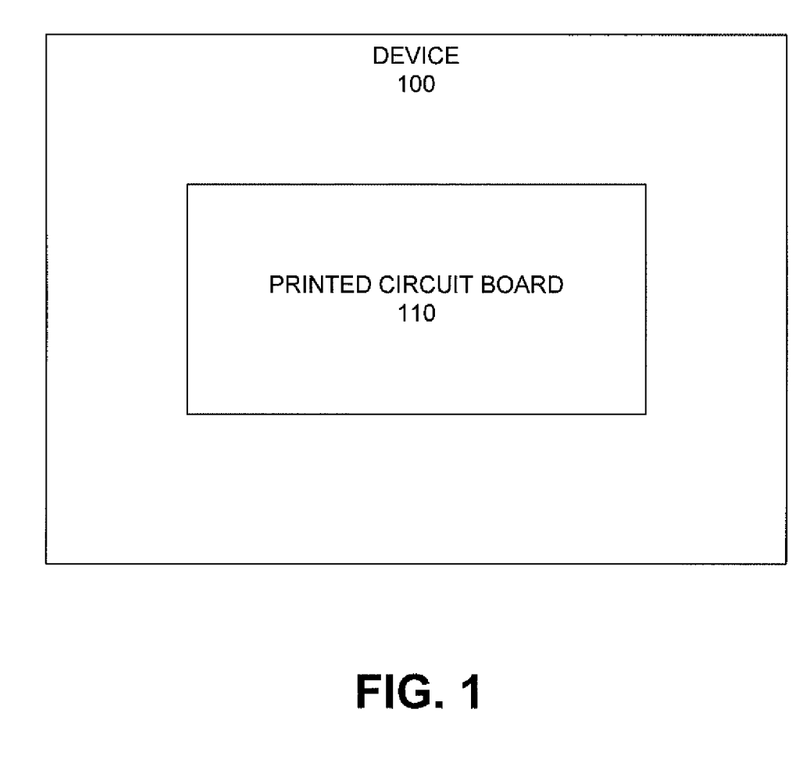
FIG. 1 is a diagram of an example device in which systems and/or methods described herein may be implemented.

FIG. 1 is a diagram of an example device 100 in which systems and/or methods described herein may be implemented. Device 100 may represent any electronic device, such as a network device (e.g., a router, a switch, etc.), a communication device, a server, a medical device, a household electronics device (e.g., a television, a vacuum, etc.), etc. Device 100 may include a printed circuit board (PCB) 110. PCB 110 may connect multiple electronic components via conductive paths through which signals and power may be transmitted. A manufacturer of PCB 110 may use an automated process to solder the multiple electronic components onto PCB 110. PCB 110, as shown in FIG. 1, may include a portion of a complete circuit board and/or may connect to other components, including, for example, an external power source (not shown in FIG. 1). For example, PCB 110 may represent a motherboard when device 110 is a computer.

In another implementation, PCB 110 may represent multiple PCBs. For example, if device 110 is configured as a router, device 110 may include multiple line cards. Each one of the line cards may include/represent a PCB. Although FIG. 1 shows what is termed a "printed circuit board," in one example implementation, PCB 110 may be replaced with any electronics-based substrate, such as, for example, rigid-flex circuits, semiconductor packages, multichip carrier modules (MCMs), micro electro mechanical systems (MEMS), ceramic circuits, midplanes, backplanes, and/or other types of substrates.

Figure 2A:
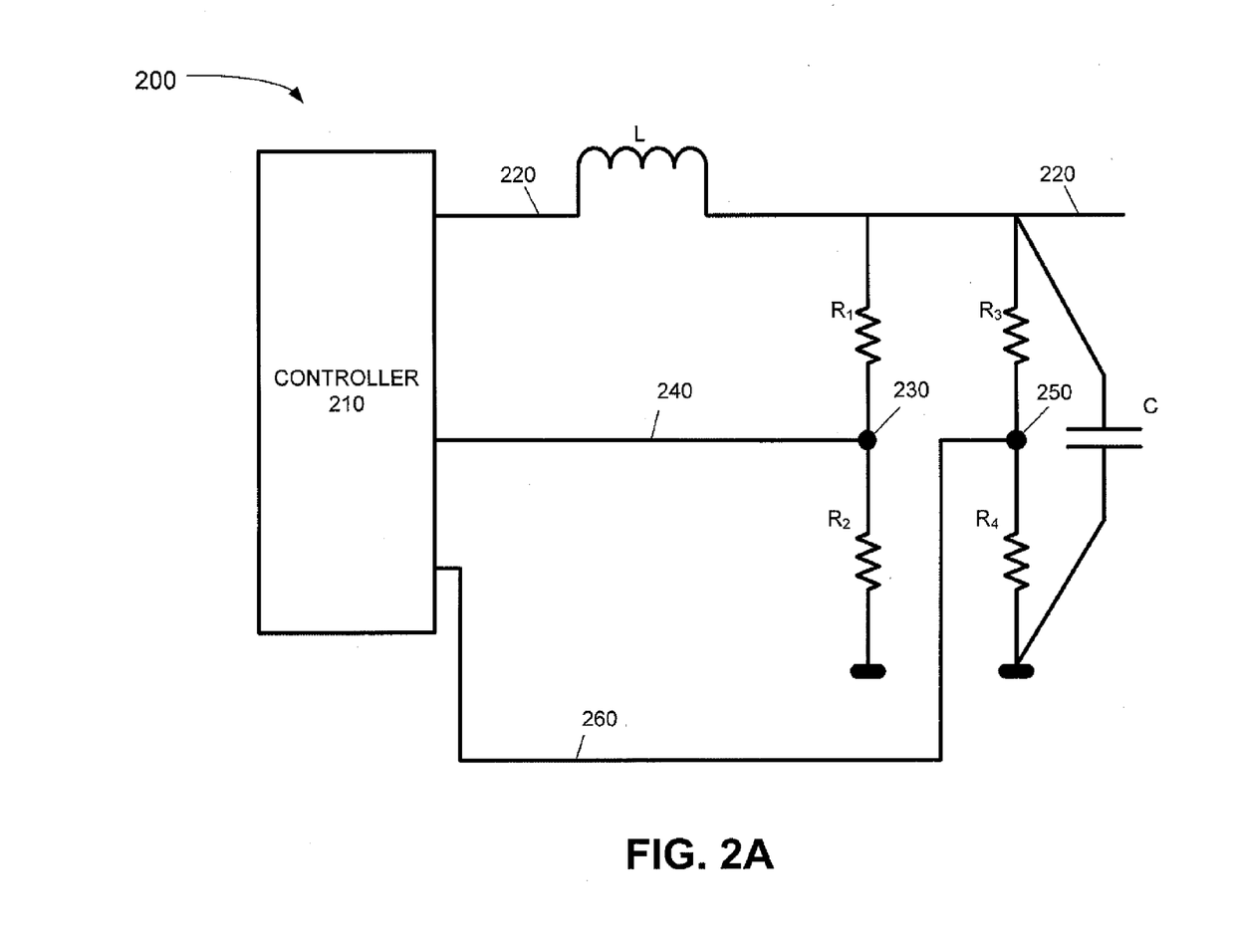
FIGS. 2A-2C are diagrams of example circuitry included in a portion of a printed circuit board (PCB) of FIG. 1.
Figure 2B:
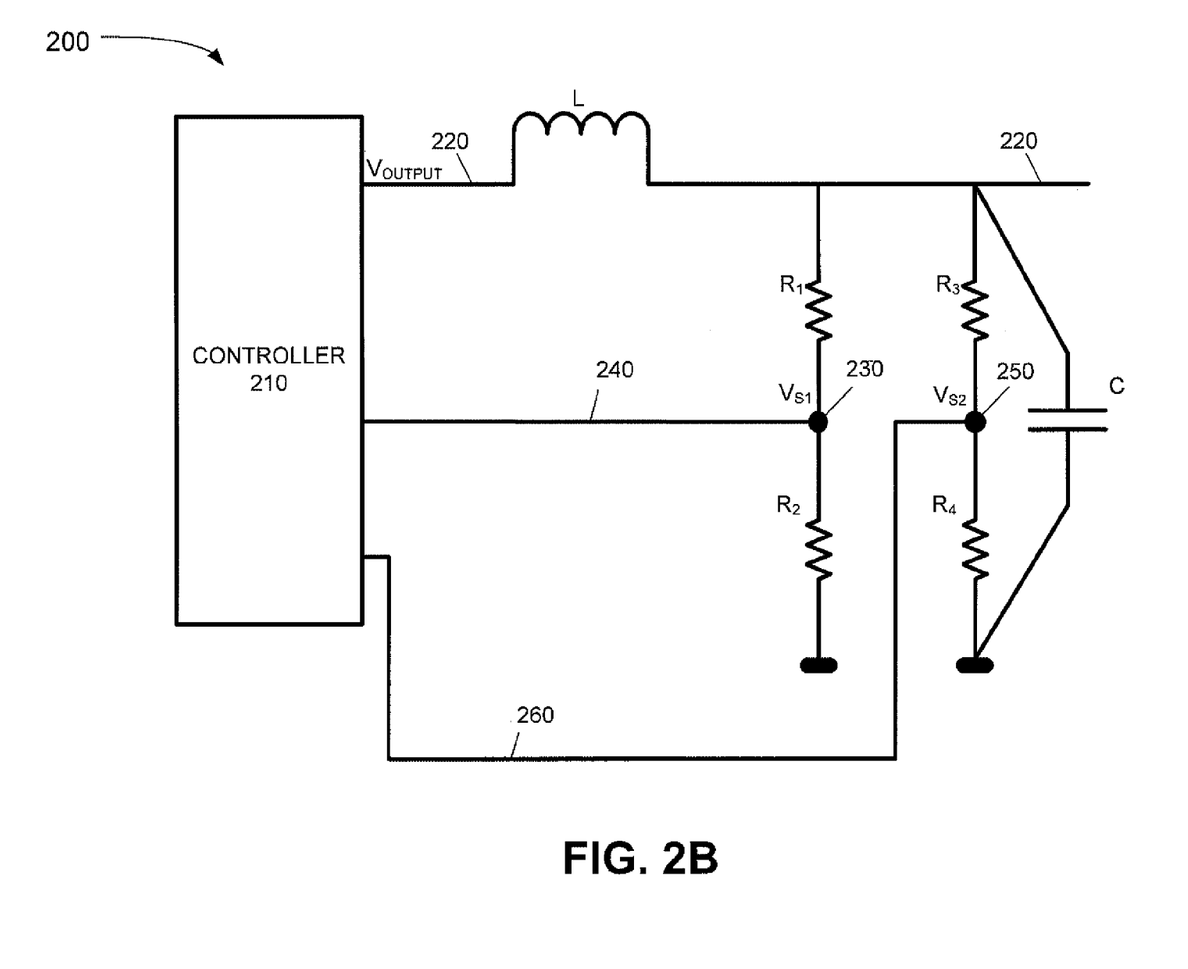
Figure 2C:
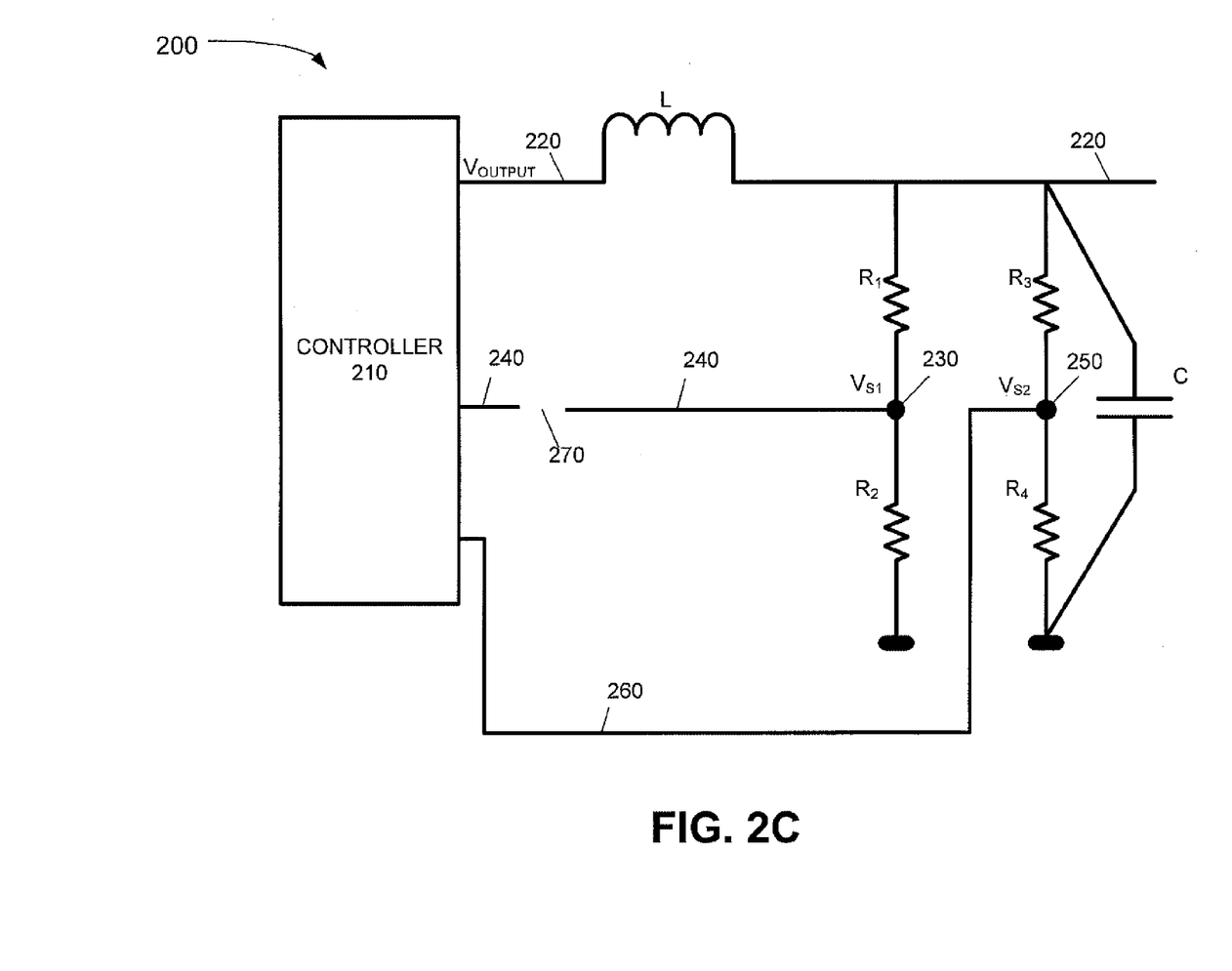

FIGS. 2A-2C are diagrams of example circuitry included in a portion 200 of PCB 110. As shown in FIG. 2A, portion 200 may include a controller 210, an output rail 220, an inductor L, resistors $R_1$, $R_2$, $R_3$, and $R_4$, a capacitor C, a feedback pin 230, a feedback connection 240, a feedback pin 250, and a feedback connection 260. Portion 200 is provided for explanatory purposes only. In practice, portion 200 may include more components, fewer components, different components, and/or differently arranged components.

Controller 210 may include any component that is able to adjust an amount of voltage being provided, via output rail 220, to PCB 110. In one implementation, controller 210 may represent a pulse-width modulation integrated circuit (PWM IC). A PWM IC may use pulse-width modulation to adjust the amount of voltage being provided to PCB 110. Controller 210 may include power circuitry, storage capacitors, a direct current (DC)/DC converter, and protection circuitry. The power circuitry may include switches and other circuitry used to receive power from a source outside of PCB 110 (or from another component of PCB 110) and deliver the power to the storage capacitors. The power may include, for example, an input voltage of a particular DC voltage. The storage capacitors may store the power received from the power circuitry. The storage capacitors may include, for example, electrolytic capacitors. In other implementations, the power circuitry and/or the storage capacitors may be located, outside of controller 210, on PCB 110.

The DC/DC converter may receive DC voltage from the storage capacitors. The DC/DC converter may include circuitry to convert a received DC voltage into another DC voltage. For example, the input voltage to the DC/DC converter may be of a first voltage (e.g., 48 volts) and the output voltage may be of a second voltage (e.g., about 1 volt) that may be adjusted based on a received voltage measurement. The protection circuitry may shut down controller 210 when an overvoltage event occurs. An overvoltage event may occur when controller 210 receives a voltage measurement that is above a predefined maximum threshold. A value of the predefined maximum threshold may vary based on a size, a sensitivity, or a type of PCB 110 and/or based on type(s) of the components on PCB 110.

Output rail 220 may receive an output voltage from controller 210, and transmit the output voltage across portion 200, via inductor L. Inductor L may represent a coil that filters the output voltage before the output voltage reaches other components (e.g., $R_1$) of portion 200. The other components of portion 200 may receive the output voltage from output rail 220 via resistors $R_1$, $R_2$, $R_3$, and $R_4$, and/or via one or more other components/connections not identified or not shown in FIG. 2A. The other components may include capacitor C, feedback pin 230, and feedback pin 250. Capacitor C may represent, for example, one or more electrolytic capacitors. Capacitor C may store the output voltage received from output rail 220. The stored output voltage may be utilized at a later point in time.

Feedback pin 230 may include any component that is able to receive, at a location of feedback pin 230, the output voltage as a first input voltage. In another implementation, feedback pin 230 may determine a first voltage measurement based on the first input voltage. Feedback pin 230 may transmit the first input voltage or the first voltage measurement, via feedback connection 240, to controller 210. Feedback pin 250 may include any component that is able to input, at a location of feedback pin 250, the output voltage as a second input voltage. Feedback pin 250 may transmit, via feedback connection 260, a measurement of the second input voltage or the second input voltage to controller 210. Although FIG. 2 shows what is termed "feedback pins," in one example implementation, feedback pins 230 and/or 250 may be replaced with other components capable of providing feedback, such as pads, balls, connectors, etc.

In one implementation, feedback pin 230 and feedback connection 240 may be on one side of PCB 110 (e.g., on same side as controller 210), and feedback pin 250 and feedback connection 260 may be on a different (i.e., the other) side of PCB 110. Feedback connection 240 and feedback connection 260 may be parallel to each other. Feedback connection 240 and feedback connection 260 may also represent connections between feedback pin 230 and feedback pin 250, respectively, to controller 210. In one example, a first distance from controller 210 to feedback pin 230 may equal a second distance from controller 210 to feedback pin 250.

In other implementations, feedback pin 230 and feedback connection 240 may be on the same side of PCB 110 as feedback pin 250 and feedback connection 260 may be on the other side of PCB 110. Feedback connection 240 and feedback connection 260 may also represent indirect connections, via one or more other components of PCB 110 (not shown in FIG. 2A). Feedback connection 240 and feedback connection 260 may not be parallel to each other and/or the first distance from controller 210 to feedback pin 230 may not equal the second distance from controller 210 to feedback pin 250. In yet other implementations, feedback pin 230 and feedback pin 250 may be positioned on PCB 110 so that a voltage input at feedback pin 230 equals a voltage input at feedback pin 250 at same point in time.

FIGS. 2B and 2C illustrate an example operation of the circuitry included in portion 200. For example, device 100, which includes PCB 110, may power on. As a result, controller 210 may receive a voltage from a power source. Controller 210 may convert the received voltage into an output voltage ($V_{OUTPUT}$). Controller 210 may transmit $V_{OUTPUT}$ across portion 200 by using output rail 220. $V_{OUTPUT}$ may move from output rail 220 to feedback pin 230 and feedback pin 250 via resistors $R_1$ and $R_3$, respectively. Feedback pin 230 may receive $V_{OUTPUT}$ as a first input voltage and/or determine a first voltage measurement ($V_{S1}$) based on the first input voltage. Feedback pin 250 may receive $V_{OUTPUT}$ as a second input voltage and/or determine a second voltage measurement ($V_{S2}$) based on the second input voltage. Controller 210 may receive $V_{S1}$ via feedback connection 240. Controller 210 may receive $V_{S2}$ via feedback connection 260. $V_{S1}$ may equal $V_{S2}$ when $V_{S1}$ and $V_{S2}$ reach controller 210. Controller 210 may adjust (i.e., increase or decrease) $V_{OUTPUT}$ based on a value of $V_{S1}$ or $V_{S2}$. In particular, controller 210 may increase $V_{OUTPUT}$ when $V_{S1}/V_{S2}$ is lower than a predefined value. Controller 210 may decrease $V_{OUTPUT}$ when $V_{S1}/V_{S2}$ is higher than the predefined value. In another implementation, controller 210 may shut down controller 210 (i.e., ending $V_{OUTPUT}$/decreasing $V_{OUTPUT}$ to zero) when $V_{S1}/V_{S2}$ is higher than the predefined value or a different predefined maximum threshold, which is greater than the predefined value.

As shown in FIG. 2C, a break 270 may exist in feedback connection 240. In one example, break 270 may exist when feedback pin 230 is (and/or feedback connection 240 is) not properly soldered to PCB 110 during production of PCB 110. The improper soldering of feedback pin 230 may occur due to a localized soldering problem on one side of PCB 210 (e.g., a side of PCB 210 that includes feedback pin 230 and does not include feedback pin 250). In another example, break 270 may occur during a use of PCB 110 (e.g., while handling PCB 110 during assembly of device 110, during an operation of PCB 110, etc.). Due to break 270, controller 210 may receive/determine a value of zero, via feedback connection 240, for $V_{S1}$. Controller 210 may determine that break 270 exists in feedback connection 240 based on $V_{S1}$.

In response to determining that break 270 exists, controller 210 may adjust $V_{OUTPUT}$ only based on a value of $V_{S2}$, which is received via feedback connection 260. In another implementation, controller 210 may also alert device 110 of break 270 by transmitting a signal to a central controller of device 110. The signal may indicate that feedback pin 230 is not properly connected to controller 210 and/or that a failure occurred on PCB 110.

In yet another implementation, controller 210 may determine that a break exists in feedback connection 260 after determining that break 270 exists in feedback connection 240. In response, controller 210 may activate protection circuitry to shut down controller 210. Controller 210 may also alert device 100 of the problem by transmitting a signal to a central controller of device 110 that indicates that feedback pin 250 is not properly connected to controller 210.

Figure 3:
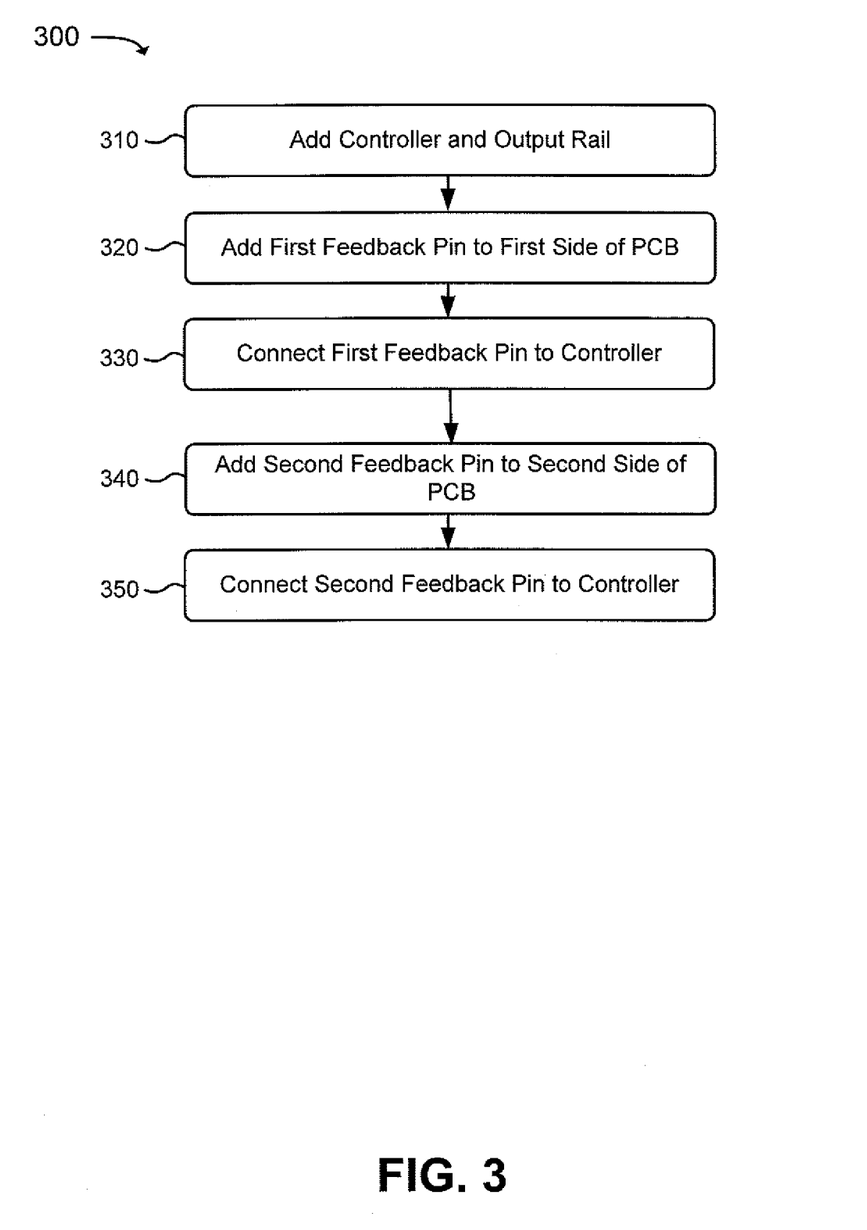
FIG. 3 is a flowchart of an example process for creating a PCB that provides overvoltage protection.

FIG. 3 is a flowchart of an example process 300 for creating a PCB (e.g., PCB 110 that includes portion 200). Process 300 may be applied to designing a PCB that provides overvoltage protection. In one implementation, a manufacturing device (e.g., one or more computing devices, robotics, PCB manufacturing devices, etc. with processors) may perform process 300.

As shown in FIG. 3, process 300 may include adding a controller and an output rail to a PCB (block 310). As show in FIGS. 2A-2C, for instance, controller 210 may be added to portion 200 of PCB 110. Controller 210 may connect to a source of power (e.g., an input voltage) that is located on PCB 110 and/or external to PCB 110. Controller 210 may input the source of power. Output rail 220 may be added to transmit an output voltage out of controller 210 and across portion 200. The other components, described being added below in process 300, may receive the output voltage from output rail 220.

Process 300 may further include adding a first feedback pin to a first side of the PCB (block 320). As show in FIGS. 2A-2C, for instance, feedback pin 230 may be placed at a first location. The first location may be a predefined distance away from controller 210. Resistor $R_1$ may be added between feedback pin 230 and output rail 220 for feedback pin 230 to receive, via resistor $R_1$, the output voltage from output rail 220.

Process 300 may further include connecting the first feedback pin to the controller (block 330). As show in FIGS. 2A-2C, for instance, feedback connection 240 may be added to connect feedback pin 230 to controller 210. In one implementation, feedback connection 240 may include a direct connection between feedback pin 230 and controller 210. In another implementation, feedback connection 240 may include an indirect connection between feedback pin 230 and controller 210. The indirect connection may include multiple connections between one or more components that are in between feedback pin 230 and controller 210.

Process 300 may further include adding a second feedback pin to a second side of the PCB (block 340). As show in FIGS. 2A-2C, for instance, feedback pin 250 may be placed at a second location. The second location may be a predefined distance away from controller 210 and on an opposite side of PCB 110 from feedback pin 230 (e.g., feedback pin 250 may be placed on the second side of PCB 110, opposite to feedback pin 230). A localized soldering problem that affects feedback pin 230 (and/or feedback connection 240 between feedback pin 230 and controller 210) may not affect feedback pin 250. The predefined distance may equal a distance between feedback pin 230 and controller 210. Resistor $R_3$ may be added between feedback pin 250 and output rail 220 for feedback pin 250 to receive, via resistor $R_3$, the output voltage from output rail 220.

Process 300 may also include connecting the second feedback pin to the controller (block 350). As show in FIGS. 2A-2C, for instance, feedback connection 260 may be added to connect feedback pin 250 to controller 210. Feedback connection 260 may include a direct connection or an indirect connection between feedback pin 250 and controller 210. In one implementation, feedback connection 260 may be parallel to feedback connection 240. In another implementation, feedback connection 260 may be added in a manner to provide a voltage, from feedback pin 250, equal to a voltage provided by feedback connection 240.

Figure 4:
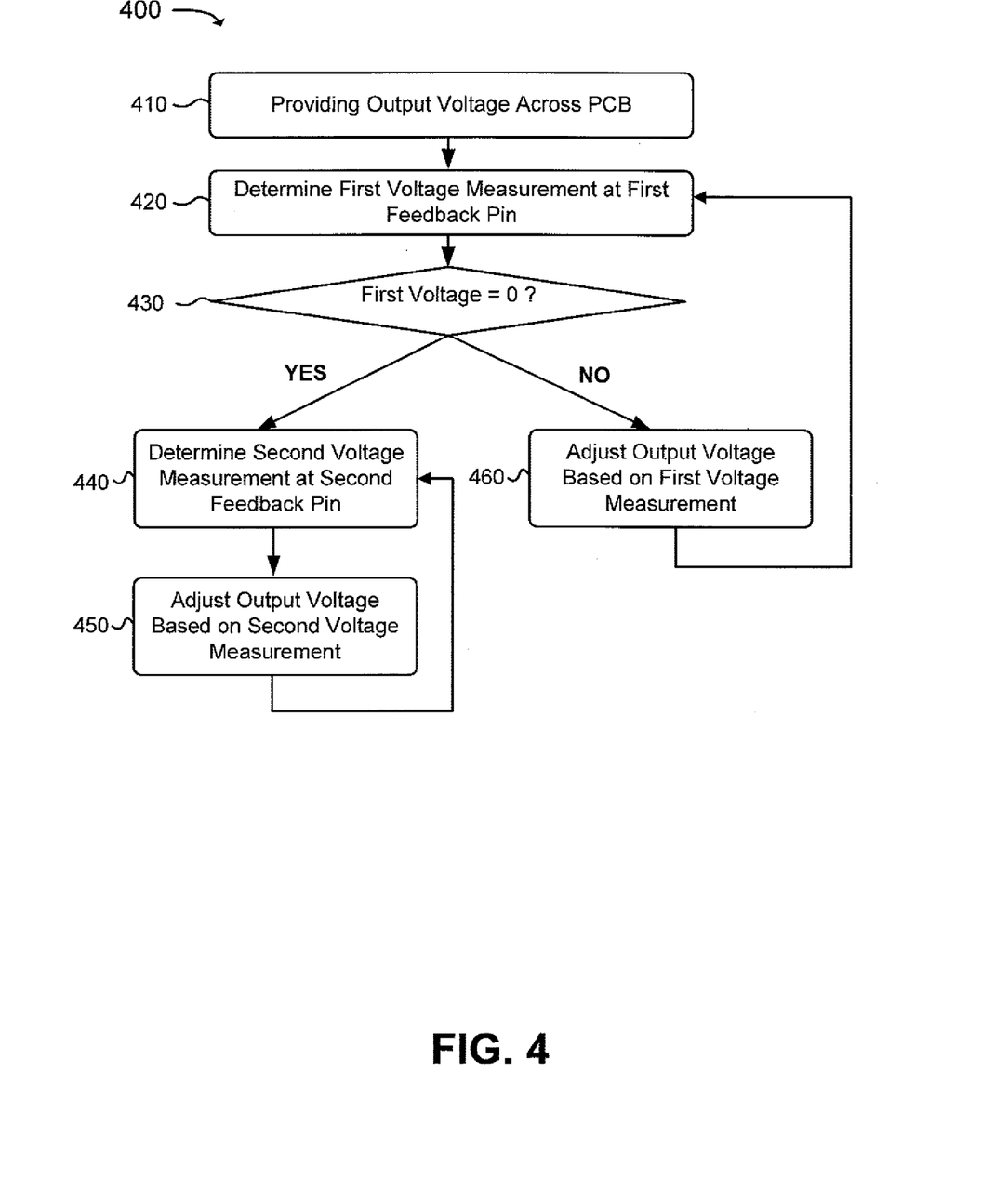
FIG. 4 is a flowchart of an example process for providing overvoltage protection.

FIG. 4 is a flowchart of an example process 400 for providing overvoltage protection. In one implementation, controller 210 may perform process 400. In other implementations, some or all of the process 600 may be performed by another component or a group of components separate and/or possibly remote from or including controller 210.

As shown in FIG. 4, process 400 may include providing an output voltage across a PCB (block 410). For example, controller 210 may receive an input voltage from a power source. Controller 210 may convert the input voltage into an output voltage. Controller 210 may provide power to PCB 110 by outputting the output voltage across PCB 110 by using output rail 220.

Process 400 may further include determining a first voltage measurement at a first feedback pin of the PCB (block 420). For example, feedback pin 230 may receive voltage from output rail 220. Feedback pin 230 may input the voltage and/or determine a first voltage measurement based on the voltage. Controller 210 may receive, via feedback connection 240, the voltage and/or the first voltage measurement from feedback pin 230. A component of controller 210 may be configured to receive the voltage particularly from feedback connection 240. In another implementation, controller 210 may determine the first voltage measurement at feedback pin 230 based on the received voltage.

Process 400 may also include determining whether the first voltage measurement is equal to zero (block 430). For example, controller 210 may determine whether the first voltage measurement is equal to zero. In another implementation, controller 210 may determine, at block 430 of process 400, whether the first voltage measurement is below a predefined minimum threshold.

If the first voltage measurement is equal to zero (block 430-YES), process 400 may further include determining a second voltage measurement at a second feedback pin of the PCB (block 440) and adjusting the output voltage based on the second voltage measurement (block 450). For example, if feedback pin 230 is not properly connected to PCB 110 and/or if a break exists in feedback connection 240, controller 210 may not receive a voltage from a location of feedback pin 230. When controller 210 does not receive the voltage from feedback pin 230, controller 210 may determine that the first voltage measurement is equal to zero.

Accordingly, instead of ramping up a value of the output voltage of controller 210 in response to the first voltage measurement that equals zero, controller 210 may determine a second voltage measurement for feedback pin 250. A component of controller 210 may be configured to receive a voltage or the second voltage measurement, for feedback pin 250, particularly from feedback connection 260. In another implementation, controller 210 may determine the second voltage measurement based on the received voltage. Controller 210 may adjust the output voltage of controller 210 based on the second voltage measurement. Thereafter, controller 210 may continuously determine updated second voltage measurements based on received voltages (block 440) and adjust the output voltage based on the updated second voltage measurements (block 450).

In another implementation, if the first voltage measurement is equal to zero (block 430-YES), process 400 may also include alerting a system associated with the PCB. For example, controller 210 may transmit signal(s) to a central controller of device 110 that indicate a failure of PCB 110 (e.g., that feedback pin 230 is not properly connected to controller 210).

If the first voltage measurement is not equal to zero (block 430—NO), process 400 may include adjusting the output voltage based on the first voltage measurement (block 460). For example, when feedback pin 230 is properly connected to PCB 110 and feedback connection 240 connects feedback pin 230 to controller 210, feedback pin 230 may receive a voltage and controller 210 may determine that the first voltage measurement, based on the received voltage, is not equal to zero. Thereafter, controller 210 may continuously determine updated first voltage measurements based on the received voltage (block 420) and adjust the output voltage based on the updated first voltage measurements (block 450).

The foregoing description of implementations provides illustration and description, but is not intended to be exhaustive or to limit the implementations to the precise form disclosed. Modifications and variations are possible in light of the above teachings or may be acquired from practice of these implementations.

For example, while series of blocks have been described with regards to FIGS. 3 and 4, the order of the blocks may be modified in other implementations. Further, non-dependent blocks may be performed in parallel.

It will be apparent that example aspects, as described above, may be implemented in many different forms of software, firmware, and hardware in the embodiments illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A circuit board comprising:
   a first feedback pin, at a first location of the circuit board, to determine a first voltage measurement at the first location;
   a second feedback pin, at a second location of the circuit board, to determine a second voltage measurement at the second location; and
   a controller to:
      determine whether the first feedback pin is disconnected from the controller,
      determine an amount of an output voltage based on the second voltage measurement when the first feedback pin is disconnected from the controller,
      determine the amount of the output voltage based on the first voltage measurement or the second voltage measurement when the first feedback pin is not disconnected from the controller, and
      adjust the amount of the output voltage transmitted across the circuit board based on at least one of the first voltage measurement or the second voltage measurement.

2. The circuit board of claim 1,
   where the first location is on a first side of the circuit board, and
   where the second location is on a second side of the second board.

3. The circuit board of claim 1, further comprising:
   a first feedback connection from the first feedback pin to the controller, and
   a second feedback connection from the first feedback pin to the controller,
   where the controller determines that the first feedback pin is disconnected from the controller when a break exists in the first feedback connection or when the first feedback pin is not properly soldered to the circuit board.

4. The circuit board of claim 3,
   where the first feedback connection is parallel to the second feedback connection,
   where the first feedback connection is a direct connection between the first feedback pin and the controller or an indirect connection, and
   where the indirect connection comprises a connection between the first feedback pin and the controller, via one or more other components of the circuit board.

5. The circuit board of claim 1, further comprising:
   an output rail,
      where the controller uses the output rail to transmits the output voltage across the circuit board, and
      where the second feedback pin receives the output voltage from the output rail.

6. The circuit board of claim 1, where the controller is further to:
   transmit a signal indicating a failure of the first feedback pin when the first feedback pin is disconnected from the controller.

7. The circuit board of claim 1, where the controller determines that the first feedback pin is disconnected from the controller when a value of the first voltage measurement is equal to zero or less than a minimum threshold value.

8. A method comprising:
   determining, by a controller of a circuit board, a first voltage measurement associated with a first feedback pin of the circuit board;
   determining, by the controller, whether the first feedback pin is disconnected from the controller based on the first voltage measurement;

determining, by the controller, a second voltage measurement associated with a second feedback pin, of the circuit board, when the first feedback pin is disconnected from the controller; and adjusting, by the controller, an output voltage of the controller based on the second voltage measurement when the first feedback pin is disconnected from the controller.

9. The method of claim 8, where determining the first voltage measurement comprises:

receiving a first voltage from the first feedback pin, where the first feedback pin inputs the output voltage as the first voltage, and determining the first voltage measurement based on the first voltage.

10. The method of claim 8, where determining whether the first feedback pin is disconnected from the controller comprises:

determining that the first feedback pin is disconnected from the controller when the first voltage measurement is equal to zero or less than a minimum threshold value.

11. The method of claim 8, where the first feedback pin is disconnected from the controller when:

the first feedback pin is not properly soldered to the circuit board, or a break exists in a connection between the first feedback pin and the controller.

12. The method of claim 8, further comprising:

receiving an input voltage from a power source; and converting the input voltage into the output voltage.

13. The method of claim 8, where adjusting the output voltage comprises:

increasing an amount of the output voltage when the second voltage measurement is below a predefined threshold, and decreasing the amount of the output voltage when the second voltage measurement is above the predefined threshold.

14. The method of claim 8, where adjusting the output voltage comprises:

determining whether the second voltage measurement is above a predefined threshold, and shutting down the controller when the second voltage measurement is above the predefined threshold, where shutting down the controller comprises ending the output voltage.

15. The method of claim 8, further comprising:

transmitting a signal indicating a failure of the first feedback pin or the circuit board when the first feedback pin is disconnected from the controller.

16. A method comprising:

providing a controller on a circuit board, where the controller comprises a converter to provide an output voltage;

providing a first feedback pin on the circuit board, where the first feedback pin is to receive the output voltage as a first input voltage; and providing a second feedback pin on the circuit board, where the second feedback pin is to receive the output voltage as a second input voltage, where the controller is further to:

adjust an amount of the output voltage based on a first voltage measurement of the first input voltage when the first voltage measurement is greater than zero, and adjust the amount of the output voltage based on a second voltage measurement of the second input voltage when the first voltage measurement is equal to zero or below a minimum predefined threshold.

17. The method of claim 16, further comprising:

connecting the first feedback pin to the controller with a first feedback connection, where the first voltage measurement is equal to zero when:

a break occurs in the first feedback connection, or the first feedback pin is not properly soldered to the circuit board during the providing of the first feedback pin.

18. The method of claim 16, where the controller further comprises:

protection circuitry to shut down the controller when the first voltage measurement or the second voltage measurement is above a predefined maximum threshold.

19. The method of claim 16, where the first feedback pin is provided on a first side of the circuit board, and where the second feedback pin is provided on a second side of the circuit board.

20. The method of claim 16, further comprising:

providing an output rail on the circuit board, where the output rail is to transmit the output voltage across the circuit board; and providing a connection between the output rail and the first feedback pin, where the connection is to transmit the output voltage to the first feedback pin, where the connection comprises a resistor.

\* \* \* \* \*